United States Patent
Boon et al.

(10) Patent No.: US 6,921,974 B2
(45) Date of Patent: Jul. 26, 2005

(54) PACKAGED DEVICE WITH THERMAL ENHANCEMENT AND METHOD OF PACKAGING

(75) Inventors: Tan Hien Boon, Singapore (SG); Liu Hao, Singapore (SG); Park Soo Gil, Singapore (SG)

(73) Assignee: United Test & Assembly Center Ltd., Singapore (SG)

( * ) Notice: Subject to any disclaimer, the term of this patent is extended or adjusted under 35 U.S.C. 154(b) by 0 days.

(21) Appl. No.: 10/400,803

(22) Filed: Mar. 28, 2003

(65) Prior Publication Data

US 2004/0188864 A1 Sep. 30, 2004

(51) Int. Cl.[7] .................. H01L 23/495; H01L 23/34
(52) U.S. Cl. .................. 257/719; 257/717; 257/713; 257/712; 257/675
(58) Field of Search .................. 257/675, 712, 257/713, 717, 718, 719, 720, 722, 787, 796, 797, 701, 706

(56) References Cited

U.S. PATENT DOCUMENTS

| | | | | |
|---|---|---|---|---|
| 5,144,412 A | * | 9/1992 | Chang et al. ............... | 257/665 |
| 5,378,924 A | * | 1/1995 | Liang ........................ | 257/675 |
| 5,977,626 A | * | 11/1999 | Wang et al. ................ | 257/707 |
| 5,990,418 A | * | 11/1999 | Bivona et al. ............. | 174/52.4 |
| 6,162,663 A | * | 12/2000 | Schoenstein et al. ....... | 438/122 |
| 6,462,405 B1 | * | 10/2002 | Lai et al. ................... | 257/675 |
| 6,528,876 B2 | * | 3/2003 | Huang ....................... | 257/706 |
| 6,599,779 B2 | * | 7/2003 | Shim et al. ................. | 438/122 |
| 6,617,200 B2 | * | 9/2003 | Sone ......................... | 438/123 |
| 6,677,185 B2 | * | 1/2004 | Chin et al. ................. | 438/122 |

FOREIGN PATENT DOCUMENTS

WO 94/06154 * 3/1994 .............. 23/433

OTHER PUBLICATIONS

U.S. Appl. No. 10/312,588, to Khiang, entitled "Packaging of Microchip Device", filed Jan. 21, 2003.
U.S. Appl. No. 10/312,589, to Khiang, entitled "Packaging of Microchip Device", filed Jan. 21, 2003.
U.S. Appl. No. 10/361,814, to Khiang, entitled "Semiconductor Package", filed Feb. 11, 2003; and.
U.S. Appl. No. 10/403,040, to Boon et al., entitled "Method of Packaging Circuit Device and Packaged Device", filed Apr. 1, 2003.

* cited by examiner

Primary Examiner—Nathan J. Flynn
Assistant Examiner—Victor A. Mandala, Jr.
(74) Attorney, Agent, or Firm—Greenblum & Bernstein, P.L.C.

(57) ABSTRACT

A plastic ball grid array package has a heat slug which is placed onto the substrate, which has the semiconductor device attached, prior to encapsulation. The heat transfer member is initially located by guide pins and fixed in place by the encapsulation.

23 Claims, 2 Drawing Sheets

PACKAGED DEVICE WITH THERMAL ENHANCEMENT AND METHOD OF PACKAGING

The present invention relates to packages for semiconductor devices and in particular to packages including a thermally conductive member for improving the thermal properties of the packaged device.

As the density of components and operating speeds of semiconductor devices increase, the power output and particularly the power density of the devices likewise increases. Accordingly, there is an increasing need for methods of packaging semiconductor devices so that the package has good thermal performance, and in particular can rapidly conduct away the heat generated by the semiconductor device to prevent it overheating.

One known packaging type with good thermal performance is known as the enhanced plastic ball grid array (E-PBGA). In such a package, a heat slug is included, either dropped in and exposed on the package's top surface or attached to the top surface of the die. Such a structure can provide good thermal performance but the process of assembling it is more complex than that of a normal plastic ball grid array package. The assembly process for an E-PBGA package is shown in FIG. 1, with the additional steps necessary for an E-PBGA, compared to the steps required to assemble a normal PBGA, shown with diagonal hatching.

The process begins with a back grind S1 to reduce the thickness of the wafer which is then mounted S2 for sawing S3 into individual devices. The PBGA substrate is then baked S4 before the dies are attached S5 to it. The adhesive used to attach the die must then be cured S6 and a plasma cleaning step S7 carried out before the wire bonding step S8 which makes the necessary electrical connections between the die and the PBGA substrate. For an enhanced PBGA package, the heat slug is then attached to the top of the die S9 and the adhesive cured S10. The heat slug serves to conduct heat away from the die when the device is operating. A further plasma clean step S11 is then carried out before the device is encapsulated in a molding step S12 and cured S13. Finally, solder balls are attached S14 to the underside of the PBGA substrate, the individual devices are separated from one another S15 and marked and packed for shipping S16.

This process is quite complex and involves many steps.

It is an object of the present invention to provide a packaged device and a method of packaging devices whereby a packaged device has good thermal properties but can be manufactured by a simpler process.

According to the present invention there is provided a packaged semiconductor device, comprising:

a substrate having a semiconductor device attached to a first side thereof;

a thermal transfer member provided on said first side of said substrate and located by at least one guide member; and mold material encapsulating said semiconductor device and at least part of said thermal transfer member.

With such a construction, the thermal transfer member can simply be placed on the substrate after attachment of the die. It is located by guide members and then fixed in place during a molding step to encapsulate the device. The necessity for separate steps of attaching the thermal transfer member to the semiconductor device and curing the adhesive is therefore avoided, simplifying and speeding up the manufacturing process.

In a preferred embodiment of the package of the invention, there are a plurality of guide members each comprising a pin attached to the substrate. Also preferably, the heat transfer member is a convex member extending over the semiconductor device and having notches to engage the pins.

According to a further aspect of the present invention, there is provided a method of packaging a semiconductor device comprising the steps of:

providing a substrate having a semiconductor device attached to a first surface thereof;

placing a thermal transfer member on said substrate, said heat transfer member being located by at least one guide member; and encapsulating said semiconductor device and at least part of said heat transfer device in a mold material.

In a preferred embodiment of the invention, there are a plurality of guide members each comprising pins which are attached to the substrate prior to attachment of the semiconductor device. The thermal transfer member preferably comprises a concave member extending over the die and having notches which engage the pins.

In this way, a semiconductor device can be packaged with a thermal transfer member to improve its thermal properties in a process requiring fewer steps than methods in which the heat transfer member is attached to the semiconductor device.

The present invention will be further described below with reference to an exemplary embodiment and the accompanying drawings, in which.

In the drawings, like parts and steps are denoted by like references.

Figure 2:
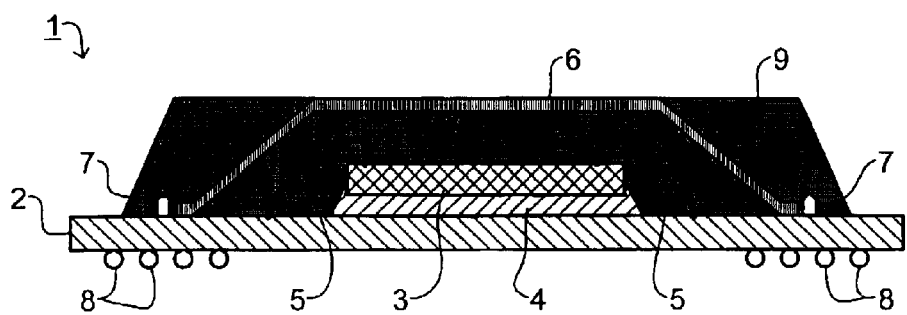
FIG. 2 is a cross-sectional view of a packaged semiconductor device according to an embodiment of the present invention.

FIG. 2 is a cross-sectional view of a packaged device 1 according to the present invention. The device 1 comprises a plastic ball grid array substrate 2 to which is attached to semiconductor device 3 via adhesive 4. Solder balls 8 are attached S14 to an underside of the plastic ball grid array substrate 2. Electrical connections between the substrate 2 and the device 3 are made by bond wires 5.

To improve the thermal properties of the package, and particularly to conduct heat away from the device 3 whilst it is operating, a thermal transfer member, or heat slug, 6 is provided. This takes the form of a convex plate extending over the die 3 and resting on the substrate 2. Pins 7 serve to locate the thermal transfer member 6 prior to encapsulation of the complete device in mold compound 9, which permanently fixes the heat slug in place.

Figure 3:
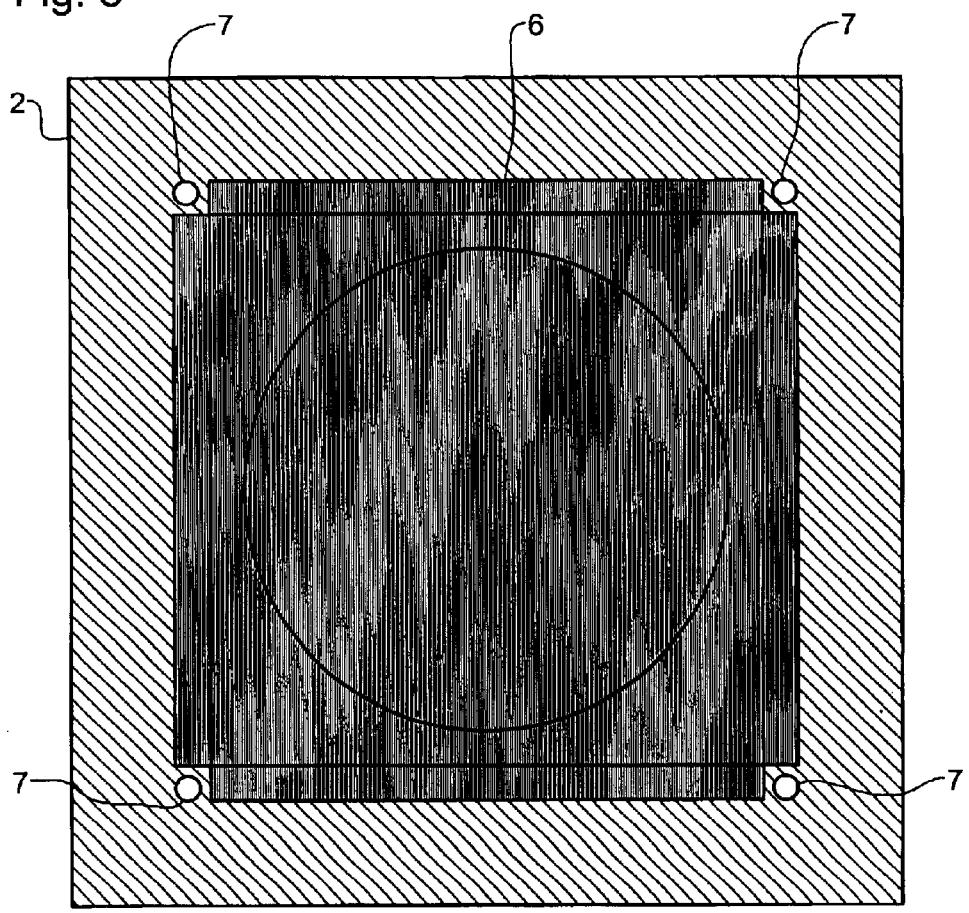
FIG. 3 is a plan view of the packaged device of FIG. 2 prior to encapsulation.

FIG. 3 shows the arrangement from above prior to encapsulation. It can be seen that the heat slug 6 has cut-outs at its four corners to engage the guide pins 7. Of course, other arrangements of guide pins and other forms of mechanical connection between the heat transfer member 6 and substrate 2 can be employed. The mechanical connection only needs to be sufficient to hold the heat slug in the correct place whilst the molding compound encapsulates the device.

Figure 1:
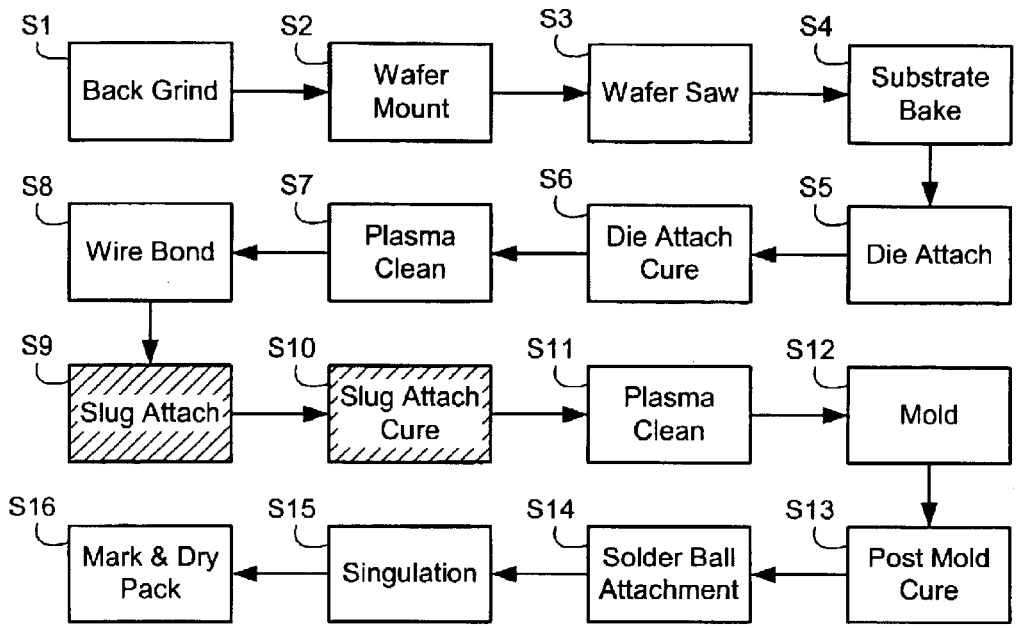
FIG. 1 is a flow chart of a prior art process for manufacturing an enhanced plastic ball grid array package.
Figure 4:
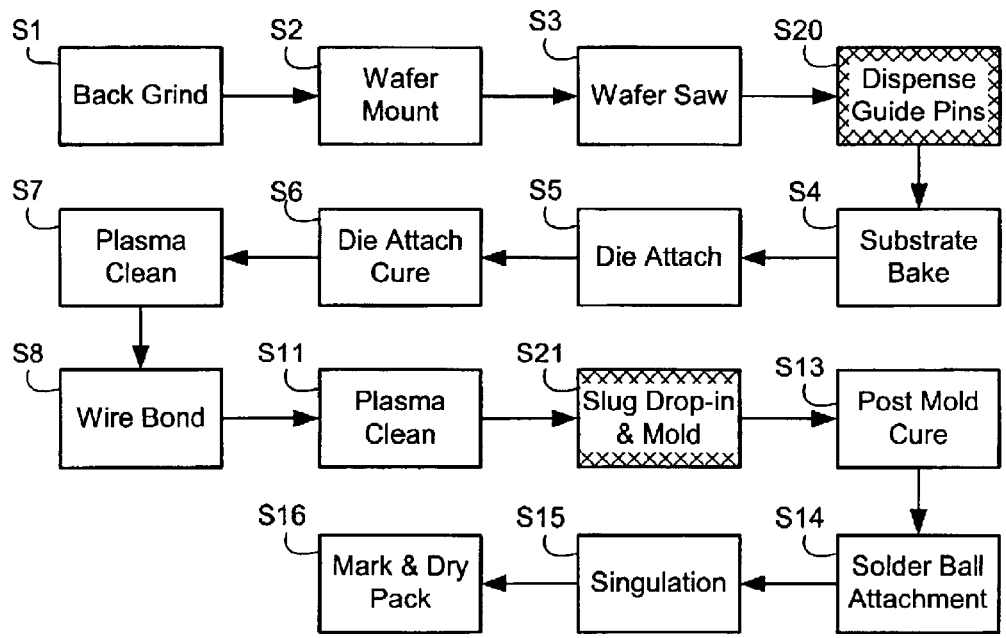
FIG. 4 is a flow chart of a process for manufacturing a packaged semiconductor device according to the present invention.

The process for manufacturing the package is shown in FIG. 4 in which the new or modified steps are shown cross-hatched. The first three steps, back grind, wafer mount and wafer saw, S1 to S3 are the same as in the prior art. After that, the guide pins are dispensed into pre-prepared holes in the substrate 2 prior to its baking S4. The process proceeds as normal, steps S5 to S11, but omitting the steps of attaching the heat slug to the die and allowing it to cure. The mold step S21 is modified in that the thermal transfer member 6 is dropped into the mold with the substrate with die attached. After molding, the process continues as normal, steps S13 to S16 (e.g., solder balls 8, shown in FIG. 2, are attached at S14).

Whilst we have described above embodiments of the present invention, it will be appreciated that this description is not intended to be limiting and that modifications to the invention, which is defined solely by the appended claims, are possible. In particular other forms of mechanical location of the thermal transfer member prior to encapsulation can be used. Also, the finished package may be of other type than a plastic ball grid array.

What is claimed is:

1. A packaged semiconductor device, comprising:
   a substrate having a semiconductor device attached to a first side of the substrate;
   a plurality of guide members each comprising a pin;
   a thermal transfer member provided on said first side of said substrate and positioned by at least one pin; and
   a mold material that encapsulates said semiconductor device and at least part of said thermal transfer member.

2. A packaged device according to claim 1, wherein part of said thermal transfer member is exposed outside said molding material.

3. A packaged device according to claim 1, wherein said thermal transfer member is convex and extends over said semiconductor device.

4. A packaged device according to claim 1, wherein part of said thermal transfer member is exposed outside said molding material.

5. A packaged device according to claim 1, wherein said thermal transfer member is convex and extends over said semiconductor device.

6. A packaged device according to claim 5, wherein part of said thermal transfer member is exposed outside said molding material.

7. A packaged device according to claim 1, wherein each pin is attached to said substrate.

8. A packaged device according to claim 7, wherein said thermal transfer member is convex and extends over said semiconductor device.

9. A packaged device according to claim 7, wherein part of said thermal transfer member is exposed outside said molding material.

10. A packaged device according to claim 7, wherein said thermal transfer member has notches corresponding to a total number of said pins.

11. A packaged device according to claim 10, wherein said thermal transfer member is convex and extends over said semiconductor device.

12. A packaged device according to claim 10, wherein part of said thermal transfer member is exposed outside said molding material.

13. A method of packaging a semiconductor device, comprising:
   attaching a semiconductor device to a first surface of a substrate;
   mounting at least one guide member to the substrate;
   placing a thermal transfer member in contact with a portion of the substrate adjacent to the at least one guide member and spaced from an area of the substrate adjacent to the semiconductor device, peripheral portions of said thermal transfer member being positioned by the at least one guide member; and
   encapsulating said semiconductor device and at least part of said thermal transfer device in a mold material.

14. A The method according to claim 13, further comprising placing the thermal transfer member on the substrate when the substrate and an attached die are placed in a mold for encapsulating.

15. The method according to claim 13, further comprising providing the thermal transfer member with peripheral notches, each configured to receive a pin.

16. The method according to claim 13, wherein the thermal transfer member is located on the first surface of the substrate.

17. A The method according to claim 13, further comprising providing a plurality of guide members, each comprising a pin attached to the substrate prior to attachment of the semiconductor device thereto.

18. A The method according to claim 17, further comprising placing the thermal transfer member on the substrate when the substrate and an attached die are placed in a mold for encapsulating.

19. A packaged semiconductor device, comprising:
   a substrate;
   a semiconductor device attached to said substrate;
   a thermal transfer member provided on said substrate;
   at least one guide member that is mounted to the substrate and that connects said thermal transfer member to the substrate, wherein the thermal transfer member is in contact with a portion of the substrate adjacent the at least one guide member and spaced from an area of the substrate adjacent to the semiconductor device; and
   a mold material that encapsulates said semiconductor device and at least a portion of said thermal transfer member.

20. The packaged semiconductor device according to claim 19, wherein said at least one guide member comprises at least one pin attached to the substrate.

21. The packaged semiconductor device according to claim 19, wherein said thermal transfer member extends over said semiconductor device and has a portion that is not encapsulated by the mold material.

22. The packaged semiconductor device according to claim 19, wherein the thermal transfer member includes peripheral notches, each configured to receive a pin.

23. The packaged semiconductor device according to claim 19, wherein the thermal transfer member is provided on the same side of the substrate as the semiconductor device.

* * * * *

UNITED STATES PATENT AND TRADEMARK OFFICE
CERTIFICATE OF CORRECTION

PATENT NO. : 6,921,974 B2
DATED : July 26, 2005
INVENTOR(S) : T. H. Boon et al.

It is certified that error appears in the above-identified patent and that said Letters Patent is hereby corrected as shown below:

Column 4,
Line 8, "thennal" should be -- thermal --.
Lines 12, 24 and 28, before "The" delete "A".

Signed and Sealed this

Fourteenth Day of March, 2006

JON W. DUDAS
*Director of the United States Patent and Trademark Office*